United States Patent [19]

Poole

[11] 3,795,877

[45] Mar. 5, 1974

[54] HIGH Q NOTCH FILTER

[75] Inventor: Margaret A. Poole, Wayland, Mass.

[73] Assignee: GTE Sylvania Incorporated, Stamford, Conn.

[22] Filed: Apr. 30, 1973

[21] Appl. No.: 355,748

[52] U.S. Cl. ............... 333/70 A, 328/165, 328/167, 330/51, 333/76

[51] Int. Cl. ............................ H03h 7/10, H03h 7/14

[58] Field of Search ............ 333/70 R, 70 A, 75, 76; 328/151, 165, 167; 330/9, 31, 51

[56] References Cited

UNITED STATES PATENTS 3,403,345 9/1968 Frank et al. ..................... 333/70 A

*Primary Examiner*—Archie R. Borchelt
*Assistant Examiner*—Marvin Nussbaum
*Attorney, Agent, or Firm*—David M. Keay; Elmer J. Nealon; N. J. O'Malley

[57] ABSTRACT

A notch filter having a first group of capacitors which are connected in recurring sequence to an input terminal by a first commutating switch. The other terminals of the first group of capacitors are connected in common through an operational amplifier to a second group of capacitors. A second commutating switch operates in synchronism with the first switch to connect each of the second capacitors in recurring sequence to a second operational amplifier. A first feedback resistance is connected from the output of the second amplifier to the input of the first amplifier, and a second resistance is connected between the input of the second amplifier and ground. A low pass filter section is connected between the output of the second amplifier and an output terminal to provide a smooth output signal. The notch filter provides maximum attenuation at the frequency of the commutating switches.

6 Claims, 3 Drawing Figures

HIGH Q NOTCH FILTER

BACKGROUND OF THE INVENTION

This invention relates to filters. More particularly, it is concerned with filters for attenuating a narrow band of frequencies, so-called notch filters.

The most widely used notch filters are passive filters of the type employing capacitors and inductors. However, for many applications notch filters of this type are unduly large, particularly because of the size of the inductors. Although many of the components of a filter may be fabricated of small size by employing various microcircuit techniques, at present it is not feasible to fabricate inductors which are significantly reduced in size.

Another notch filter which is smaller in size is the resistance-capacitance type of active filter. However, filters of this type must be carefully tuned. In addition, obtaining stability over a wide temperature range is difficult.

SUMMARY OF THE INVENTION

Notch filters in accordance with the present invention have high Q, are stable over a wide range of operating temperatures, and are of relatively small physical size. A notch filter in accordance with the invention has an input terminal for receiving input signals and an output terminal. A first section of the filter has an input connection which is connected to the input terminal and an output connection. The first section includes a first switching means which is connected to one of the two connections of the first section. The first section also includes a first plurality of N capacitors. Each capacitor has one terminal connected to the first switching means. The other terminals of all the capacitors are connected in common to the other of the two connections of the first section. The first switching means operates to connect the one terminal of any one capacitor at a time to the one connection thereby connecting the capacitor between the input and output connections of the first section.

A second section which is similar to the first has an input connection which is coupled to the output connection of the first section and has an output connection. The second section includes a second switching means connected to one of the two connections of the second section and also includes a second plurality of N capacitors. Each of the capacitors has one terminal connected to the second switching means and the other terminals are connected in common to the other of the two connections of the second section. The second switching means operates to connect one terminal of any one capacitor at a time to the one connection of the second section thereby connecting the capacitor between the input and output connections of the second section.

The filter also includes an isolation amplifier which has its input connection connected to the output connection of the second section and its output coupled to the output terminal of the filter. A first resistance is connected between the output connection of the first section and the output of the isolation amplifier. A second resistance is connected between the input of the isolation amplifier and a point of reference potential. A switch driving means is connected to the first and to the second switching means. The switch driving means causes the first switching means to connect each of the first plurality of capacitors between the input and output connections of the first section in a recurring sequence with repeats at a predetermined frequency. The switch driving means also causes the second switching means to connect each of the second plurality of capacitors between the input and output connections of the second section in a recurring sequence which repeats at the same predetermined frequency. The switch driving means makes connections to the capacitors of the first and second sections in synchronism. The notch filter operates to attenuate an input signal at the predetermined frequency more than input signals of frequencies which are less than or more than the predetermined frequency.

BRIEF DESCRIPTION OF THE DRAWINGS

Additional objects, features, and advantages of notch filters in accordance with the present invention will be apparent from the following detailed discussion together with the accompanying drawings wherein.

DETAILED DESCRIPTION OF THE INVENTION

Figure 1:
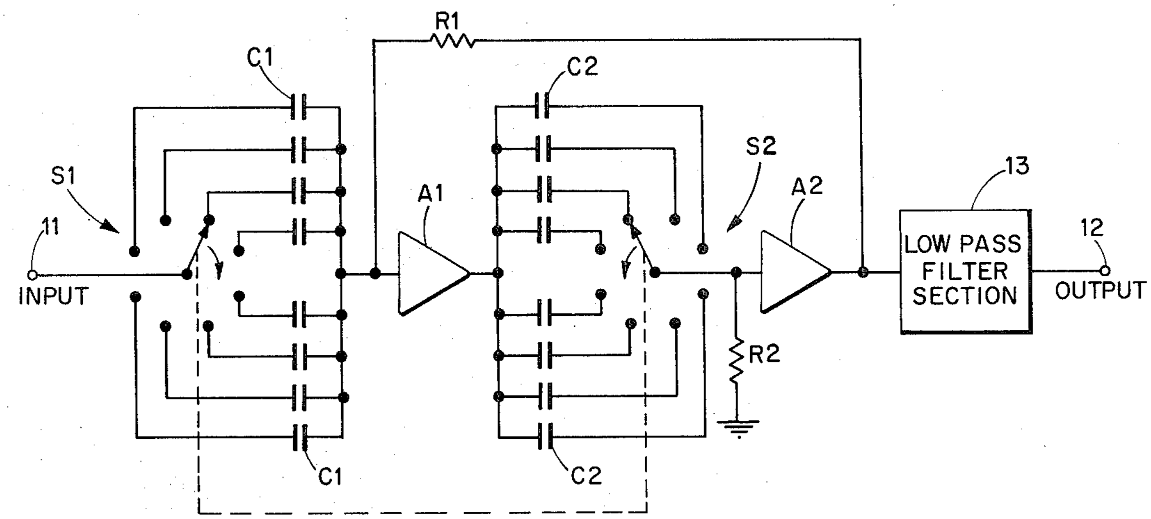
FIG. 1 is a schematic representation of a notch filter in accordance with the invention.

FIG. 1 is a schematic representation of a notch filter in accordance with the present invention. The filter includes a first section having a commutating switch S1 which is indicated schematically as having a rotating contact and eight stationary contacts. The input terminal 11 of the filter is connected directly to the rotating contact. Each of the stationary contacts of the switch is connected to a terminal of one of a first group of eight capacitors C1. The other terminals of the capacitors C1 are connected to each other to provide an output connection from the first section.

The common output connection of the first section is connected to the input of an isolation amplifier A1. The output of the isolation amplifier A1 is connected to the input connection of a second section. The second section includes a commutating switch S2 also having a rotating contact and eight stationary contacts. Each of the eight stationary contacts is connected to one of the capacitors of a group of eight capacitors C2. The other terminals of the capacitors C2 are connected together and to a common input connection of the second section. This input connection is connected to the output of the isolation amplifier A1. The rotating contact of the second switch S2 is connected to the output connection of the second station.

The output of the second section is connected to the input of a second amplifier A2. A first resistance R1 is connected between the output of the second amplifier A2 and the input of the first amplifier A1 in a feedback connection. A second resistance R2 is connected between the input to the second amplifier A2 and ground. The output of the second amplifier A2 is connected to the output terminal 12 of the filter through a low pass filter section 13.

The rotating contacts of the two switches S1 and S2 are operated in synchronism so that they contact corresponding capacitors in the two groups C1 and C2 at the same time.

The notch filter of FIG. 1 operates to produce a notch in the frequency spectrum at the frequency $f_o$ at which switches S1 and S2 are driven; that is, the frequency of rotation of the rotating contacts. When the frequency of the input signal applied at the input terminal 11 is exactly equal to $f_o$, each capacitor of the first group C1 is connected during the same segment of each succeeding cycle of the signal. Similarly, the same capacitors C2 of the second group are connected in the circuit during the same segments of each succeeding cycle. After several cycles, a charge is built up on each of the capacitors. Under these circumstances the net DC voltage across resistances R1 and R2 is zero, and therefore the output of the filter is zero.

If the frequency of the input signal is a harmonic of $f_o$, each capacitor is connected during the same segments of the signal. Thus, the output of the filter is again zero.

If the input signal frequency is $f_o + \Delta f$, while the switches S1 and S2 are continuing to rotate at a frequency of $f_o$, the input signal to each of the capacitors changes at a frequency of $\Delta f$. Therefore, the amplitude of the output of the filter at a frequency of $f_o + \Delta f$ is equal to the output of a high pass filter at a frequency of $\Delta f$.

If the input frequency is $f_0 - \Delta f$, the input signal at each capacitor also changes at a frequency of $\Delta f$. In this situation the amplitude of the output of the filter is also equal to the output of a high pass filter at a frequency of $\Delta f$. That is, when the input frequency is other than $f_o$, or a harmonic thereof, a voltage difference is generated across the resistances R1 and R2 and a voltage is produced at the output of the second amplifier A2.

The low pass filter section 13 serves to filter out the high frequency transients which are generated by switching between the contacts of the switches. In addition, since each capacitor is charged to a different voltage level. the low pass filter section smoothes out the voltage steps between adjacent capacitors.

Figure 2:
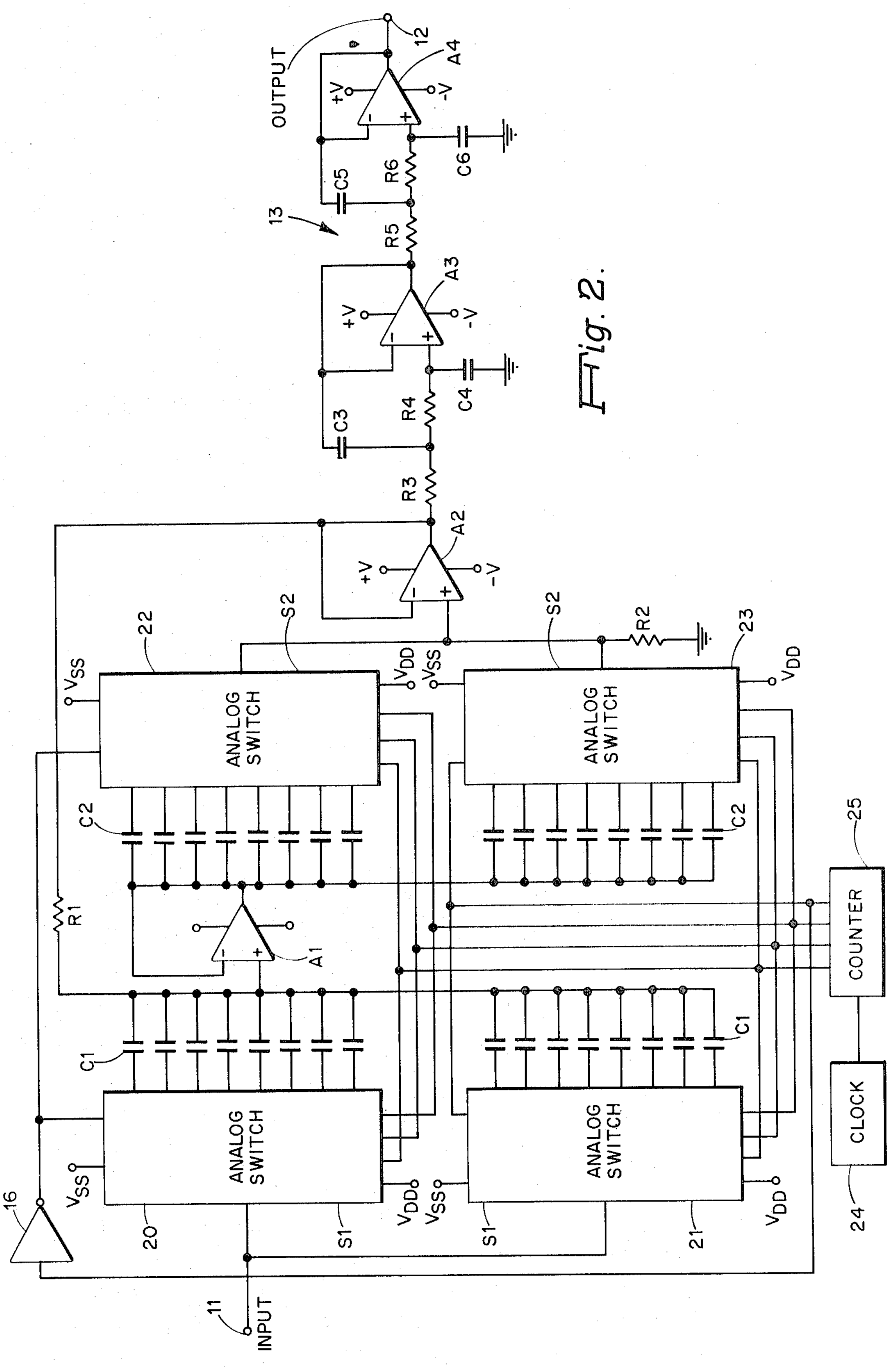
FIG. 2 is a detailed circuit diagram of a notch filter in accordance with the invention.

FIG. 2 is a detailed circuit diagram of a notch filter as illustrated in block diagram form in FIG. 1. In the circuit of FIG. 2 the first switch S1 employs two analog switches 20 and 21. Each analog switch has one input connection and eight output connections. Each analog switch has three control connections. Depending upon which of eight possible combinations of binary signals are applied to the control connections, a particular one of the eight output connections is connected to the single input connection. There is also an enabling connection to each analog switch which must be activated to establish the connection determined by the signals to the control connections.

A group of 16 capacitors C1 each have one terminal connected to an output connection of the analog switches 20 and 21. The other terminals of the capacitors C1 are connected to a common connection.

The second section of the filter also includes two analog switches 22 and 23 which constitute the second switch S2. The switches 22 and 23 are essentially the same as the first switches 20 and 21. A second group of sixteen capacitors C2 each have one terminal connected in common. The other terminals are connected to 16 input connections of the two analog switches 22 and 23.

The switches are operated by a driving arrangement of a source of clock pulses 24 and a counter 25. The counter 25 is a 4-bit counter which counts through a recurring sequence of 16 different output combinations. Three of the outputs of the counter 25 are applied to the three control connections of each of the analog switches 20, 21, 22, and 23. The fourth output is connected directly to the enabling connections of the analog switches 21 and 23 and to the enabling connections of analog switches 20 and 22 through an inverter 16. Thus, over a full count of 16 clock pulses from the clock 24 the counter 25 causes each of the first group of 16 capacitors C1 to be connected in sequence to the input terminal 11. Similarly, the capacitors C2 of the second group are connected into the circuit in synchronism with the corresponding capacitors C1 of the first group.

The first section is coupled to the second section by a first operational amplifier A1. The amplifier A1 has a non-inverting input connection which is connected directly to the common connection of the first group of capacitors C1. The output of the amplifier A1 is connected directly to the common connection of the second group of capacitors C2. There is a direct feedback connection from the output of the amplifier A1 to its inverting input connection. The operational amplifier A1 has unity gain and serves to isolate the first section from the second section of the filter.

The second amplifier A2 is also an operational amplifier and has its non-inverting input connected directly to the single output connections from each of the analog switches 22 and 23. A direct feedback connection is provided from the output of the amplifier A2 to its inverting input. This amplifier also has unity gain.

A first resistance R1 is connected in a feedback arrangement between the output of the second amplifier A2 and the non-inverting input of the first amplifier A1. A second resistance R2 is connected between the non-inverting input of the second amplifier A2 and ground.

The low pass filter section 13 is a known type of filter employing two stages with two operational amplifiers A3 and A4. The output of the second operational amplifier A2 is applied to the non-inverting input of amplifier A3 by way of resistances R3 and R4. A capacitor C3 is connected in feedback from the output of amplifier A3 to the juncture of resistances R3 and R4. The output of amplifier A3 is directly connected in feedback to its inverting input. A capacitor C4 is connected between the non-inverting input and ground.

The second stage of the low pass filter section is similar, including two resistances R5 and R6 in series between the output of amplifier A3 and the non-inverting input of amplifier A4. A capacitor C6 is connected between the non-inverting input and ground. A capacitor C5 is connected in feedback from the output of the amplifier A4 to the juncture of resistances R5 and R6. A direct feedback connection is provided between the output of amplifier A4 and its inverting input. The output of amplifier A4 is connected to the output terminal 12 of the filter.

The apparatus of FIG. 2 operates in the same manner as previously described in the discussion of the schematic representation of FIG. 1. The notch filter attenuates signals of the frequency at which the counter 25 counts through a complete sequence of 16 binary output signals. That is, maximum attenuation occurs at one-sixteenth of the frequency of the pulses from the clock 24. The low pass filter section 13 serves to provide a smooth output eliminating the effects of switching transients and the steps between the voltage levels to which the capacitors are charged.

Following is a list of components of a specific embodiment of a notch filter according to the invention as illustrated in FIG. 2:

| | |
|---|---|
| Analog switches **20**, **21**, **22**, **23** | AM3705 |
| Operational amplifiers A1, A2, A3, A4 | 741 |
| C1 | 1000 pf |
| C2 | 1000 pf |
| C3 | 1000 pf |
| C4 | 330 pf |
| C5 | 0.0068 $\mu$f |
| C6 | 100 pf |
| R1 | 82.5 KΩ |
| R2 | 66.5 KΩ |
| R3 | 226 KΩ |
| R4 | 88.7 KΩ |
| R5 | 93.1 KΩ |
| R6 | 30.1 KΩ |
| +V | +15 volts |
| −V | −15 volts |
| $V_{SS}$ | + 5 volts |
| $V_{DD}$ | −15 volts |
| Clock frequency | 41.6 KHz |

Figure 3:
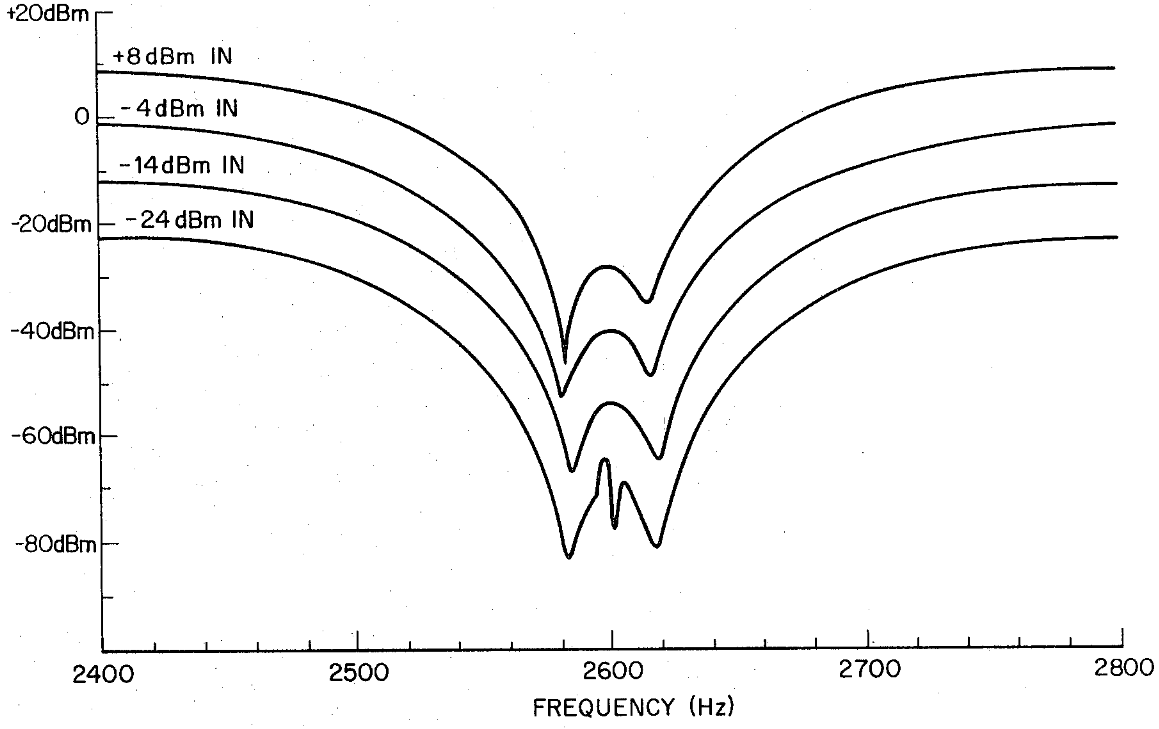
FIG. 3 is a graph illustrating the frequency response of a notch filter as illustrated in FIG. 2 and having specific component values.

FIG. 3 is a graph illustrating the frequency response of the notch filter of FIG. 2 employing the components in the foregoing list. Maximum attenuation is at 2,600 Hz (1/16th of 41.6 KHz). The graph shows frequency response for several levels of input signals. As can be seen from the curves of the graph, attenuation is greater than 30 dB from 2,580 to 2,620 Hz and is less than 3 dB at frequencies below 2,460 Hz and above 2,740 Hz.

Thus, a notch filter in accordance with the present invention provides a relatively high Q. In addition, operation is very stable with temperature, depending primarily on the stability of the clock. The components as listed are available in integrated circuit or other microcircuit form. No inductors are required. Therefore, the entire notch filter including the low pass filter section is of very small size occupying a volume of approximately 1.5 cubic inches.

While there has been shown and described what is considered a preferred embodiment of the present invention, it will be obvious to those skilled in the art that various changes and modifications may be made therein without departing from the invention as defined by the appended claims.

What is claimed is:

1. A notch filter for attenuating an input signal of a predetermined frequency more than input signals of frequencies less than or more than said predetermined frequency, said filter comprising in combination an input terminal adapted to receive input signals;

an output terminal;

a first section having an input connection connected to said input terminal and an output connection, said first section including a first switching means connected to one of said connections, and a first plurality of N capacitors each having one terminal connected to the first switching means and having the other terminals connected in common to the other of said connections, said first switching means being operable to connect the one terminal of any one capacitor at a time to said one connection thereby connecting the capacitor between the input and output connections of the first section;

a second section having an input connection coupled to the output connection of the first section and an output connection, said second section including a second switching means connected to one of said connections, and a second plurality of N capacitors each having one terminal connected to the second switching means and having the other terminals connected in common to the other of said connections, said second switching means being operable to connect the one terminal of any one capacitor at a time to said one connection thereby connecting the capacitor between the input and output connections of the second section;

an isolation amplifier having its input connected to the output connection of the second section and its output coupled to said output terminal;

a first resistance connected between the output connection of the first section and the output of the isolation amplifier;

a second resistance connected between the input of the isolation amplifier and a point of reference potential; and switch driving means connected to the first and second switching means for causing the first switching means to connect each of the first plurality of capacitors between the input and output connections of the first section in a recurring sequence which repeats at said predetermined frequency, and for causing the second switching means to connect each of the second plurality of capacitors between the input and output connections of the second section in a recurring sequence which repeats at said predetermined frequency in synchronism with said first switching means.

2. A notch filter in accordance with claim 1 including a low pass filter connected between the output of the isolation amplifier and the output terminal for filtering out high frequency switching transients and steps in the voltage levels of adjacent capacitors.

3. A notch filter in accordance with claim 2 wherein said isolation amplifier is an operational amplifier exhibiting unity gain.

4. A notch filter in accordance with claim 3 including a second isolation amplifier having its input connected to the output connection of the first section and its output connected to the input connection of the second section.

5. A notch filter in accordance with claim 4 wherein said first-mentioned isolation amplifier is an operational amplifier having an inverting input connection and a non-inverting input connection, the inverting input connection being connected to the output of the amplifier and the non-inverting input connection being connected to the output connection of the second section; and said second isolation amplifier is an operational amplifier having an inverting input connection and a non-inverting input connection, the inverting input connection being connected to the output of the amplifier and the non-inverting input connection being connected to the output connection of the first section.

6. A notch filter in accordance with claim 5 wherein said first switching means includes an analog switch having a single terminal connected to the one of said connections of the first section, a plurality of N terminals each of which is connected to one of the terminals of a different one of said first plurality of capacitors, and a group of control terminals;

said first switching means being operable to connect said single terminal to any one of said plurality of terminals as determined by the combination of control signals applied at said control terminals;

said second switching means includes an analog switch having a single terminal connected to the one of said connections of the second section, a plurality of N terminals each of which is connected to one of the terminals of a different one of said second plurality of capacitors, and a group of control terminals;

said second switching means being operable to connect said single terminal to any one of said plurality of terminals as determined by the combination of control signals applied at said control terminals; and said switch driving means includes a digital counter connected to the control terminals of said first and second switching means and operable to count input pulses through a recurring sequence of N combinations of control signals, and a source of clock pulses connected to said digital counter for generating input pulses to be counted thereby, said clock pulses being generated at the rate of N times said predetermined frequency.

* * * * *